US008964605B1

(12) United States Patent
Ansari (10) Patent No.: US 8,964,605 B1
(45) Date of Patent: Feb. 24, 2015

(54) METHOD AND APPARATUS FOR INTEGRATING A TRANSCEIVER AND A HALF-DUPLEXING SPLIT BALUN

(71) Applicant: Quantenna Communications, Inc., Fremont, CA (US)

(72) Inventor: Saied Ansari, Oakland, CA (US)

(73) Assignee: Quantenna Communications, Inc., Fremont, CA (US)

( * ) Notice: Subject to any disclaimer, the term of this patent is extended or adjusted under 35 U.S.C. 154(b) by 240 days.

(21) Appl. No.: 13/761,147

(22) Filed: Feb. 6, 2013

(51) Int. Cl.
*H04B 7/005* (2006.01)
*H03H 7/42* (2006.01)
*H03H 7/38* (2006.01)
*H03H 7/46* (2006.01)
*H04B 1/44* (2006.01)

(52) U.S. Cl.
CPC . *H03H 7/42* (2013.01); *H03H 7/38* (2013.01); *H03H 7/465* (2013.01); *H04B 1/44* (2013.01)
USPC ............................ 370/278; 370/282; 370/283

(58) Field of Classification Search
USPC .......................... 370/276, 277, 278, 282, 283
See application file for complete search history.

(56) References Cited

U.S. PATENT DOCUMENTS

| 6,735,418 | B1 | 5/2004 | MacNally et al. | |
|---|---|---|---|---|
| 6,760,434 | B1 * | 7/2004 | Rezvani et al. | 379/402 |
| 6,768,410 | B1 | 7/2004 | Yazaki et al. | |
| 7,283,793 | B1 | 10/2007 | McKay | |
| 7,468,640 | B2 | 12/2008 | Nosaka | |
| 7,899,409 | B2 | 3/2011 | Huang et al. | |
| 8,279,018 | B1 * | 10/2012 | Song et al. | 333/25 |
| 2003/0193377 | A1 | 10/2003 | Quan et al. | |
| 2004/0075435 | A1 | 4/2004 | Weyers et al. | |
| 2004/0217823 | A1 | 11/2004 | Tayrani et al. | |
| 2005/0105637 | A1 | 5/2005 | Fitzpatrick et al. | |
| 2005/0184831 | A1 | 8/2005 | Yasuda et al. | |
| 2006/0281418 | A1 | 12/2006 | Huang et al. | |
| 2010/0246454 | A1 | 9/2010 | Ansari et al. | |
| 2012/0188917 | A1 * | 7/2012 | Knox | 370/277 |
| 2012/0262217 | A1 * | 10/2012 | Gorbachov et al. | 327/382 |
| 2014/0050124 | A1 * | 2/2014 | Yang et al. | 370/278 |

* cited by examiner

*Primary Examiner* — Chi H Pham
*Assistant Examiner* — Weibin Huang
(74) *Attorney, Agent, or Firm* — IP Creators; Charles C Cary (57) ABSTRACT

A transceiver comprising a plurality of components coupled to one another to form a transmit path and a receive path and a balun. The balun comprises a primary inductor, two pairs of secondary inductors and switched impedance modules. The primary inductor is configured to couple to the communications medium at an unbalanced port end. The two pairs of secondary inductors are each configured to electromagnetically couple with the primary inductor and each providing an associated one of two balanced, ports coupled to components forming the transmit path and the receive path. The switched impedance modules are each coupled to a corresponding one of the two pairs of secondary inductors to switchably split into a virtual open, one pair of secondary inductors associated with an inactive, one of the balanced ports and to couple another pair of secondary inductors associated with an active one of the balanced ports either to each other or to a virtual ground.

17 Claims, 5 Drawing Sheets

FIG. 1A — PRIOR ART Switched Antenna

FIG. 1B — PRIOR ART Switched Ports

BALUNs with Switched Split Secondary Inductors on Balanced Ports

FIG. 5

METHOD AND APPARATUS FOR INTEGRATING A TRANSCEIVER AND A HALF-DUPLEXING SPLIT BALUN

BACKGROUND OF THE INVENTION

1. Field of Invention

The field of the present invention relates in general to transceivers and particularly to baluns for half-duplexed wireless and wired communications transceivers.

2. Description of the Related Art

Baluns are transformer like devices for converting an unbalanced signal to a balanced signal and vice-versa. Typical applications involve wire line and wireless transceivers. In these communications transceivers the balun couples an unbalanced signal from an antenna in the case of wireless communications or a coaxial or optical cable in the case of wire line communications with the balanced signals processed by the transmit and receive path components of the transceiver. In communications transceivers the balun typically also matches the impedances of the transmit and receive path components, i.e. the system, to the impedances of the load, e.g. the antenna or the coaxial of optical cable. In receive mode a balun takes the received signal and converts it to a balanced signal, typically expressed as two signals, a phase and anti-phase signal, on which receive operations such as noise cancellation can be performed. In transmit mode a balun takes a differential signal from the transmit path components and converts it to an unbalanced signal to drive the load, e.g. antenna, coaxial or optical cable. One of the most challenging balun designs is identified as a half-duplexing balun. A half-duplexing balun switches back and forth between transmit and receive communications. Such baluns are used even in very high speed communications, where switch performance is a major impediment to efficient balun performance.

What is needed in half-duplexing balun design with improved high speed transmit and receive switching performance characteristics.

SUMMARY OF THE INVENTION

The present invention provides a method and apparatus for integrating a transceiver and a half duplexing split balun. A transceiver supporting communications on a communications medium is disclosed. The transceiver comprises a plurality of components coupled to one another to form a transmit path and a receive path and a balun. The balun comprises a primary inductor, two pairs of secondary inductors and switched impedance modules. The primary inductor is configured to couple to the communications medium at an unbalanced port end thereof. The two pairs of secondary inductors are each configured to electromagnetically couple with the primary inductor and each providing an associated one of two balanced ports coupled to the plurality of components forming the transmit path and the receive path respectively. The switched impedance modules are each coupled to a corresponding one of the two pairs of secondary inductors to switchably split into a virtual open one pair of secondary inductors associated with an inactive one of the balanced ports and to couple another pair of secondary inductors associated with an active one of the balanced ports either to each other or to a virtual ground; thereby supporting half duplex transmit or receive communications via opposing switch states on the secondary inductors of the two balanced ports.

The invention may be implemented in hardware, firmware or software.

An associated balun as well as associated methods are also claimed.

BRIEF DESCRIPTION OF THE DRAWINGS

These and other features and advantages of the present invention will become more apparent to those skilled in the art from the following detailed description in conjunction with the appended drawings in which.

DETAILED DESCRIPTION OF THE EMBODIMENTS

Figure 1A:
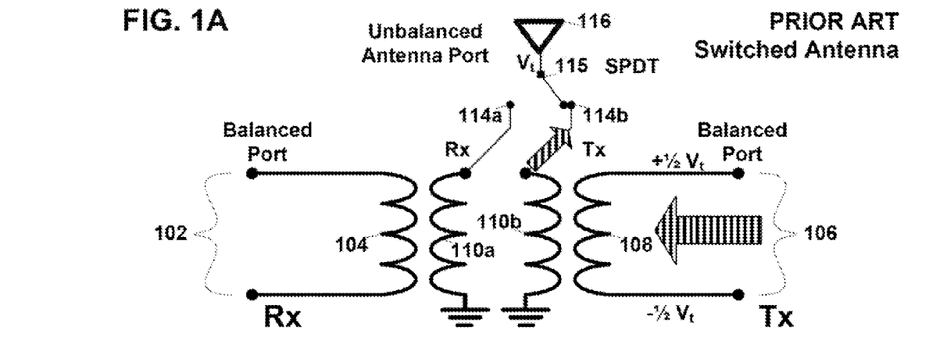
FIGS. 1A, 1B are electrical circuit block diagrams of prior art switched antenna and switched port half duplexing baluns.
Figure 1B:
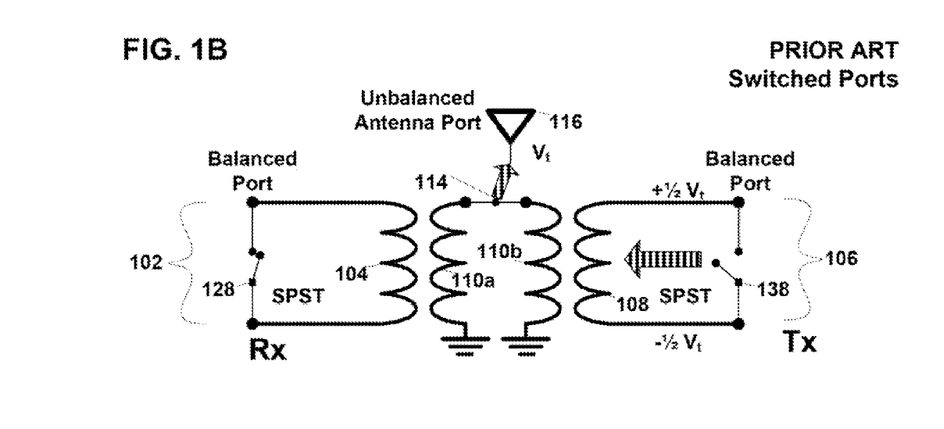

FIGS. 1A, 1B are electrical circuit block diagrams of prior art switched antenna and switched port half duplexing baluns respectively. Each balun consists of a pair of inductors 110a, 110b forming a primary inductor for coupling at an unbalanced or common port to a load, e.g. antenna 116 or a coaxial or optical cable (not shown). Two secondary inductors 104 and 108 electromagnetically couple with the primary inductor and provide each of the two balanced ports 106, 102 for transmit and receive communications. The balun converts between a signal on the common port with a voltage $V_t$ to signals on the balanced port with voltages $+\frac{1}{2}V_t$ and $-\frac{1}{2}V_t$. The balun is identified as a half-duplexing balun because it supports switching between transmit only or receive only communications at the very high rates.

FIG. 1A shows a prior art approach to half-duplexing, in which a switched antenna is used to enable a half-duplexing behavior in the balun. In FIG. 1A a single pole double throw (SPDT) switch 115 couples the antenna to either the balanced receive port 102 or the balanced transmit port 106. Specifically in the receive switch state, switch 115 couples the antenna via unbalanced port 114a and associated primary and secondary inductors 110a and 104 respectively to the receive balanced port 102. Alternately, in the transmit switch state, switch 115 couples the antenna via unbalanced port 114b and associated primary and secondary inductors 110b and 108 respectively to the transmit balanced port 106.

FIG. 1B shows another prior art approach to half-duplexing the balun in which switches across the balanced ports are used to enable a half-duplexing behavior in the balun. In FIG. 1B a single pole single throw (SPST) switch 128 across the balanced receive port and another SPST switch 138 across the balanced transmit port are used to enable half-duplexing behavior. Specifically the load, e.g. antenna 116 or coaxial cable or optical cable (not shown) is coupled via the unbalanced port 114 with the primary inductor and specifically inductors 110a, 110b. Opposing switch states, i.e. open and closed, are used to enable one set of balanced ports and disable another. In FIG. 1b switch 128 short circuits balanced port 102 thereby disabling the balanced receive port and switch 138 open circuits the transmit balanced port 106 thereby enabling the transmit balanced port. Opposing switch states (not shown) are used to enable reception and disable transmission.

Both switch arrangements shown in FIGS. 1A, 1B include a switch in the selected active one of the transmit or receive path which degrades performance. Both switch arrangements are further characterized in varying degrees by one or more of: voltage spikes during switch transitions and parasitic leakage particularly in the case where switching is accomplished by complementary metal-oxide semiconductor (CMOS) transistor switches.

Figure 2A:
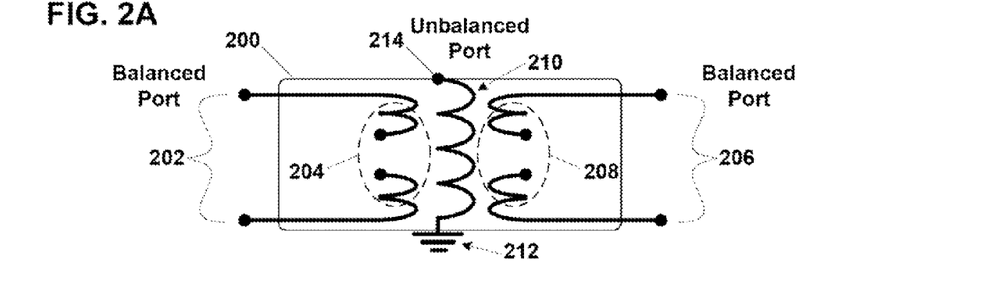
FIG. 2A is an electrical circuit block diagram of the loop type inductor portions of a balun in accordance with an embodiment of the invention.

FIG. 2A is an electrical circuit block diagram of the loop type inductor portions of a half-duplexing balun 200 in accordance with an embodiment of the invention. In this embodiment of the invention a single primary loop inductor 210 coupled to ground 212 is shown supporting an unbalanced port 214. In an alternate embodiment of the invention, two discrete single balanced port baluns form balun 200 and provide two unbalanced ports electrically coupled to one another to form a single unbalanced port and two balanced ports. The primary loop inductor is shown electromagnetically coupled to both secondary inductors 204 and 208 associated with the receive and transmit balanced ports 202 and 206 respectively. Both secondary inductors 204 and 208 are split into a corresponding pair of secondary inductors, with the resultant split ends or nodes supporting half-duplex switching arrangements shown in the following FIGS. 2A-2B.

Figure 2B:
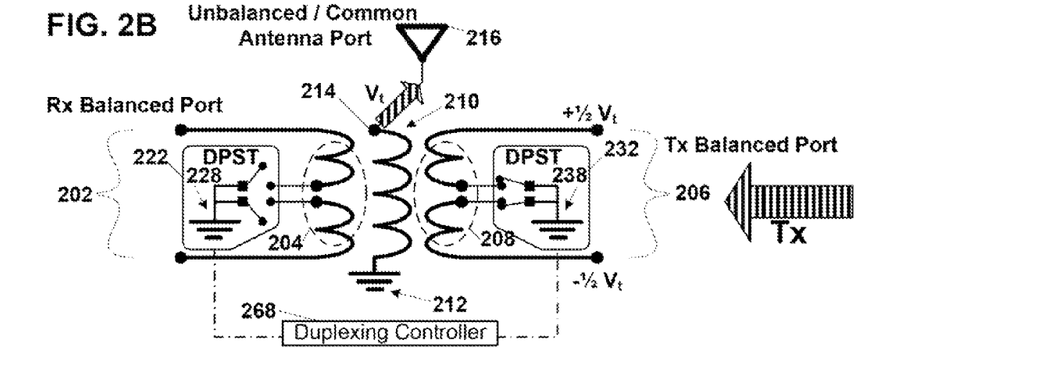
FIGS. 2B-2C are electrical circuit block diagrams of switched inductor half-duplexing baluns in accordance with an embodiment of the invention.
Figure 2C:
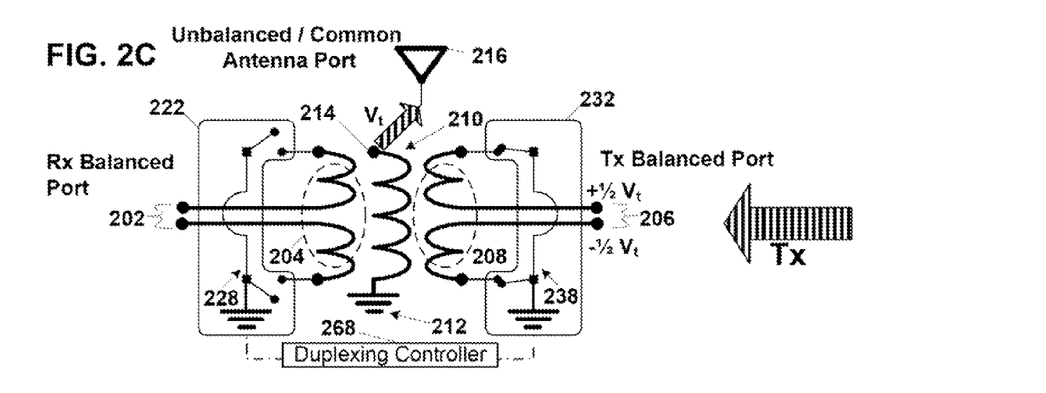

FIGS. 2B-2C are electrical circuit block diagrams of switched inductor half-duplexing baluns in accordance with an embodiment of the invention. Half-duplexing switching in these arrangements is not on the transmit or receive paths and is thus quieter, less prone to leakage and hence more efficient than prior art techniques.

In FIG. 2B switched impedance modules 222 and 232 are coupled to the split ends of each of the secondary inductor pairs 204 and 208 respectively. These modules operate under control of the duplexing controller 268 to activate a port by generating a high impedance coupling between one pair of split secondary inductors associated with the inactive port and a low impedance coupling between the other pair of split secondary inductors associated with the selected active port. In the embodiment shown each switched impedance module 222 and 232 includes a double pole single throw (DPST) switch 228, 238 respectively. In the embodiment shown the DPST switches couple to an electrical ground. In another embodiment of the invention the DPST switches do not have a ground connection but do in the closed state couple the split ends of the corresponding secondary inductor to one another. In either embodiment of the invention the DPST switch associated with an active port couples the split pair of secondary inductors associated with the active one of the balanced ports to one another, and open circuits or maintains the split between the secondary inductor pair associated with the inactive port. In FIG. 2B the switched impedance module associated with the receive balanced port generates a high impedance, e.g. open switch state, on the secondary inductor pair associated with the balanced receive port and low impedance, e.g. closed switch state, for the secondary inductor pair associated with the balanced transmit port. In this half-duplexing switch state only the transmit port 206 is activated such that a balanced signal voltage, e.g. +½Vt and −½Vt thereon is efficiently coupled via the unbalanced port 214 to the antenna 216 to produce a voltage swing of 0 to +1Vt thereon.

In FIG. 2C an electrically equivalent circuit diagram of the half-duplexing balun of FIG. 2B is shown with the split secondary inductor switch coupling and the balanced port geometry flipped. In FIG. 2C switched impedance modules 222 and 232 are coupled to the split ends of each of the secondary inductor pairs 204 and 208 respectively. These modules operate under control of the duplexing controller 268 to activate one balanced port and deactivate the other for selectable half-duplexing communications, i.e. transmit only or receive only communications. In the embodiment shown each switched impedance module 222 and 232 includes a double pole single throw (DPST) switch 228, 238 respectively. In either embodiment of the invention the DPST switch associated with an active port couples the split pair of secondary inductors associated with the active one of the balanced ports to one another through the associated DPST switch, and open circuits the secondary inductor pair associated with the inactive port. In FIG. 2C the switches of the receive 222 and transmit 232 switched impedance modules are set to high impedance and low impedance respectively thereby deactivating the receive balanced port 202 and activating the transmit balanced port 206.

Figure 3A:
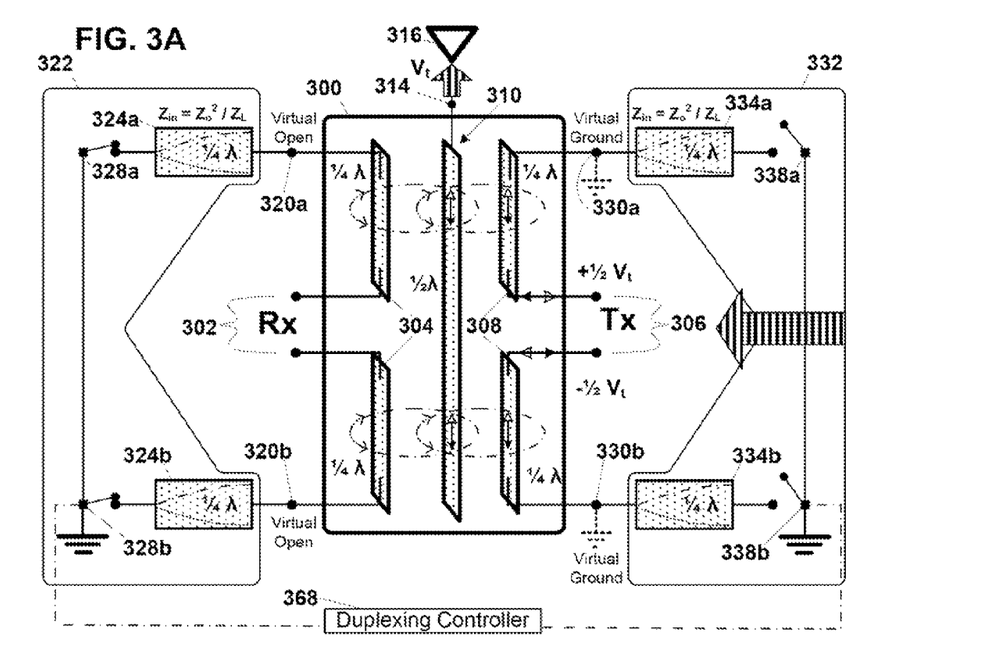
FIGS. 3A, 3B are electrical circuit block diagrams of transmission line type half-duplexing baluns in accordance with an embodiment of the invention.
Figure 3B:
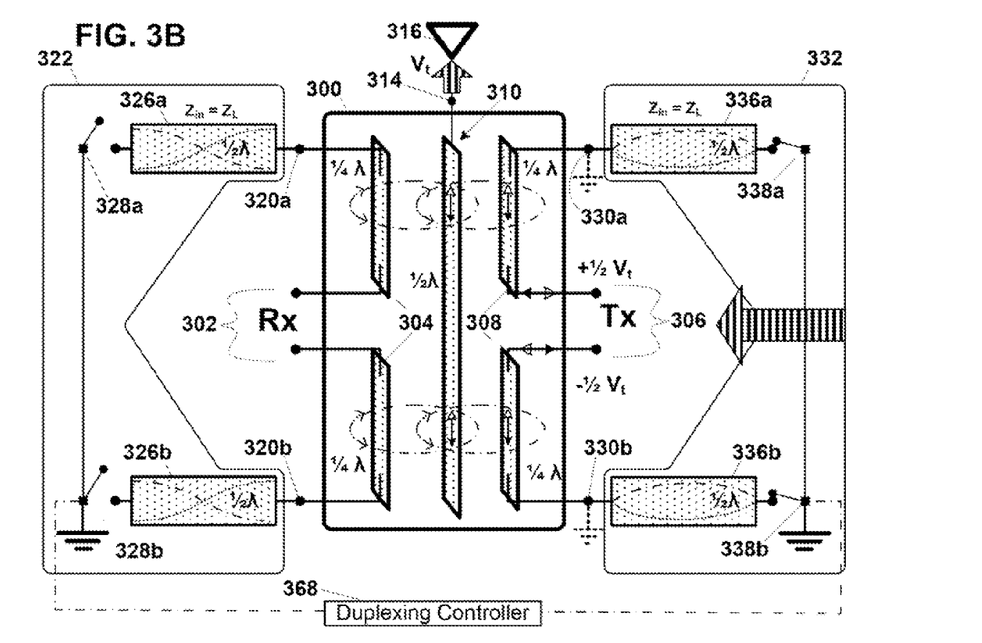

FIGS. 3A, 3B are electrical circuit block diagrams of transmission line type half-duplexing baluns in accordance with an embodiment of the invention. This embodiment of the invention is particularly suitable for half-duplexing communications at high frequencies. The balun is designed not only to provide the requisite balanced to unbalanced signal transform but also to match the impedance of the load $Z_L$, e.g. antenna or coaxial or optical cable, to the impedance of the source $Z_O$, e.g. transmit or receive path of the associated transceiver, thereby maximizing power transfer between the associated transceiver coupled to the balun at the balanced ports and the load coupled to the balun at the unbalanced ports.

The inductive components of the balun are transmission line segments precisely designed to support standing waves at the communications center frequency of the associated transceiver. The center frequency in an embodiment of the invention is the center frequency of the communication band at which the associated transceiver operates. The center frequency in another embodiment of the invention is the center frequency of the communication channel at which the transceiver operates. Each transmission line segment forming either: the primary inductors, the secondary inductors, or the switched impedance modules is further dimensioned to support a specific portion of a standing wave resulting from the incident and the reflected communication signals at the center frequency of the communications, e.g. ¼λ or ½λ where lambda (λ) is the wavelength at the center frequency of the communications.

FIGS. 3A, 3B show the balun 300 and associated switched impedance modules 322 and 332. The balun includes a primary inductor in the form of a ½λ transmission line segment 310 providing an unbalanced port coupling 314 to the communication medium or load, represented in this case by antenna 316. Secondary inductors 304 and 308 couple electromagnetically with the primary inductor. The secondary inductors 304, 308 are split into a corresponding pair of ¼λ transmission line segments which support an associated balanced port 302, 306 respectively at one end and couple to the associated switched impedance modules 322 and 332 at the other end. Balanced port 302 is designated for coupling the received communications to the receive path components of the associated transceiver (See FIG. 4). Balanced port 306 is designated for coupling the transmitted communications from the transmit path components of the associated transceiver.

Each switched impedance module 322, 332 controls the activation or deactivation of the associated one of the balanced ports 302, 306 respectively. Each switched impedance module 322, 332 includes associated transmission line segments 324a-324b, 334a-334b respectively which are switchably coupled in series between the split ends of the associated secondary inductor pair and an electrical ground. The switched impedance modules operate under control of the duplexing controller 368 to activate one balanced port and deactivate the other for selectable half-duplexing communications, i.e. transmit only or receive only communications.

In the embodiment shown in FIG. 3A each impedance module includes ¼λ transmission line segments switchably coupled to an electrical ground. Switched impedance module 322 includes ¼λ transmission line segments 324a,324b coupled to the split ends of the associated secondary inductor pair 304 at interfaces 320a, 320b. Each transmission line segment 324a, 324b is switchably coupled to an electrical ground by DPST switches 328a, 328b. Switched impedance module 332 includes ¼λ transmission line segments 334a, 334b coupled to the split ends of the associated secondary inductor pair 308 at interfaces 330a, 330b. Each transmission line segment 334a, 334b is switchably coupled to an electrical ground by DPST switches 338a, 338b. In FIG. 3A the transmit port is active as a result of the virtual ground established by the switched impedance module 332 at split ends 330a, 330b. DPST switches 338a, 338b are open resulting in the positioning of a node of the ¼λ standing waves within transmission line segments 334a, 334b at the split ends 330a-330b. The node in the standing wave is equivalent to a virtual ground of the split ends. Conversely, the receive port is inactive as a result of the virtual open established by the switched impedance module 322 at split ends 320a, 320b. DPST switches 328a, 328b are closed resulting in the positioning of an antinode of the ¼λ standing waves within transmission line segments 324a, 324b at the split ends 320a-320b. The anti node in the standing wave is equivalent to a virtual open of the split ends.

In the embodiment shown in FIG. 3B each impedance module includes ½λ transmission line segments switchably coupled to an electrical ground. Switched impedance module 322 includes ½λ transmission line segments 326a, 326b coupled to the split ends of the associated secondary inductor pair 304 at interfaces 320a, 320b. Each transmission line segment 326a, 326b is switchably coupled to an electrical ground by DPST switches 328a, 328b. Switched impedance module 332 includes ½λ transmission line segments 336a, 336b coupled to the split ends of the associated secondary inductor pair 308 at interfaces 330a, 330b. Each transmission line segment 336a, 336b is switchably coupled to an electrical ground by DPST switches 338a, 338b. In FIG. 3B the transmit port is active as a result of the virtual ground established by the switched impedance module 332 at split ends 330a, 330b. DPST switches 338a, 338b are closed resulting in the positioning of a node of the ½λ standing waves within transmission line segments 336a, 336b at the split ends 330a-330b. Conversely, the receive port is inactive as a result of the virtual open established by the switched impedance module 322 at split ends 320a, 320b. DPST switches 328a, 328b are open resulting in the positioning of an antinode of the ½λ standing waves within transmission line segments 326a, 326b at the split ends 320a-320b.

Switch states in the switched impedance modules 322 and 332 are used to establish either a node or an antinode of a standing wave at the split ends of the secondary inductors pairs associated with each of the balanced ports.

A node in the portion of the standing wave established at the split ends of the secondary inductors by the associated switched impedance module corresponds electrically to a virtual ground or low impedance coupling of those split ends where incident and reflected waves of the communications center frequency combine 180 degrees out of phase and cancel one another. A balanced port having such virtual grounds established at the split ends of its secondary inductor pair is active.

Conversely, an antinode in the portion of the standing wave established at the split ends of the secondary inductors corresponds electrically to a virtual open or high impedance coupling of those split ends where incident and reflected waves of the communications center frequency combine in phase creating the virtual open. A balanced port having such virtual opens established at the split ends of its secondary inductor pair is inactive.

The standing waves are established in the transmission line segments 324a-324b and 334a-334b which are part of the switched impedance modules 322, 332 respectively. The position of the standing wave is governed by the switch state, i.e. open or closed of the DPST switches 328a-328b and 338a-338b of the switched impedance modules 322, 332 respectively.

In FIG. 3A where the transmission line segments are ¼λ a node in the standing wave corresponding to a virtual ground is established at the split ends of the secondary inductor when the associated DPST switch of the switched impedance module is open. In FIG. 3B where the transmission line segments are ½λ a node in the standing wave corresponding to a virtual ground is established at the split ends of the secondary inductor when the associated DPST switch of the switched impedance module is closed.

Typically the impedance of the transmission line segments matches the impedance of the secondary inductor segment to which they are attached. The input impedance $Z_{in}$ of the ¼λ transmission line segments 3243a, 324b, 334a, 334b shown in FIG. 3A is expressed as $Z_0^2/Z_L$ where $Z_0$ is the system impedance and $Z_L$ is the load impedance. The input impedance Zin of the ½λ transmission line segments 324a, 324b, 334a, 334b shown in FIG. 3B is expressed as $Z_L$ where $Z_L$ is the load impedance. The ¼ wavelength transmission line segments in alternate embodiments may be implemented as odd integer multiples of ¼λ without departing from the scope of the Claimed invention. The ½ wavelength transmission line segments in alternate embodiments may be implemented as integer multiples of ½λ without departing from the scope of the Claimed invention.

Figure 4:
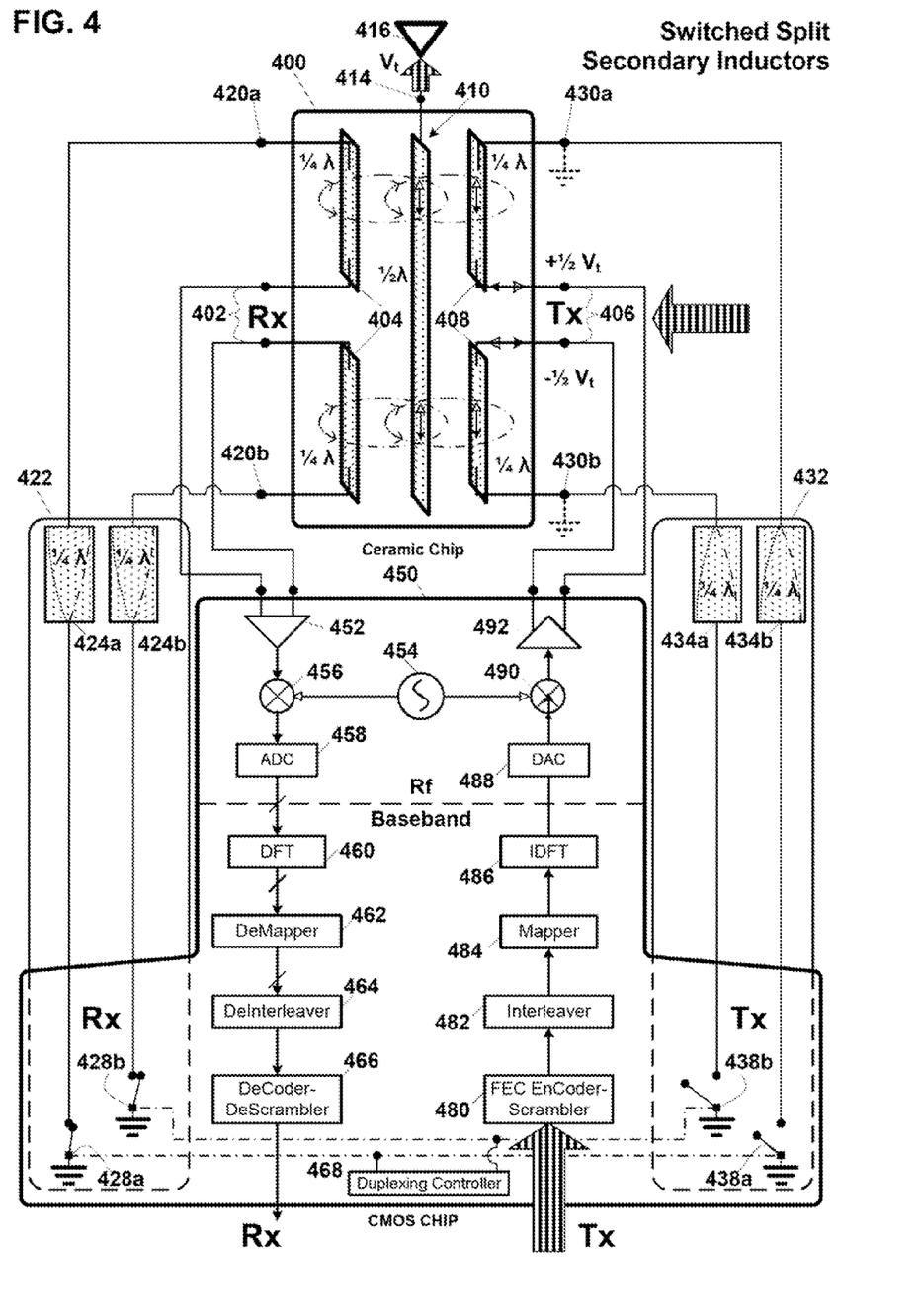
FIG. 4 is a detailed hardware block diagram of a transmission line half-duplexing balun integrated with a wireless transceiver associated with an embodiment of the invention.

FIG. 4 is a detailed hardware block diagram of a transmission line half-duplexing balun integrated with a wireless transceiver associated with an embodiment of the invention. The wireless transceiver shown conforms with the requirements for an IEEE 802.11 wireless transceiver. Other wired and wireless transceiver types can be integrated with the novel split switched secondary half-duplexing balun of the current invention without departing from the scope of the claimed invention.

A balun 400 and associated switched impedance modules 422 and 432 are shown coupled to a transceiver 450. As discussed above, the transceiver in this embodiment of the invention is a wireless transceiver. Due to differences in the packaging technology and printed circuit board layout the balun, perhaps a low temperature co-fired ceramic (LTCC) may be on a separate chip from the transceiver which can be implemented on one or more complementary metal-oxide semiconductor (CMOS) chips. As shown in FIG. 4 the switched impedance modules 422 and 432 include ¼λ transmission line segments 424a-424b and 434a-434b respectively which may in an embodiment of the invention may be implemented as traces on the printed circuit board to which the balun and transceiver chips are fastened. The switched impedance modules 422 and 432 also include corresponding transistor switches 426a-426b and 436a-436b respectively which are, in this embodiment of the invention integral with the CMOS transceiver chip(s). Additionally, the duplexing controller 468 may also be implemented integrally with the CMOS transceiver chip(s).

FIG. 4 shows the balun 400 and associated switched impedance modules 422 and 432. The balun includes a primary inductor in the form of a ½λ transmission line segment 410 providing an unbalanced port coupling 414 to the communication medium or load, represented in this case by antenna 416. Secondary inductors 404 and 408 couple electromagnetically with the primary inductor. The secondary inductors 404, 408 are split into a corresponding pair of ¼λ transmission line segments which support an associated balanced port 402, 406 respectively at one end and couple to the associated switched impedance modules 422 and 432 at the other end. Balanced port 402 is designated for coupling the received communications to the receive path components of the associated transceiver 450. Balanced port 406 is designated for coupling the transmitted communications from the transmit path components of the associated transceiver 450.

Each switched impedance module 422, 432 controls the activation or deactivation of the associated one of the balanced ports 402, 406 respectively. Each switched impedance module 422, 432 includes associated transmission line segments 424a-424b, 434a-434b respectively which are switchably coupled in series between the split ends of the associated secondary inductor pair and an electrical ground. The switched impedance modules operate under control of the duplexing controller 468 to activate one balanced port and deactivate the other for selectable half-duplexing communications, i.e. transmit only or receive only communications.

In the embodiment shown in FIG. 4 each switched impedance module includes ¼λ transmission line segments switchably coupled to an electrical ground. Switched impedance module 422 includes ¼λ transmission line segments 424a, 424b coupled to the split ends of the associated secondary inductor pair 404 at interfaces 420a, 420b. Each transmission line segment 424a, 424b is switchably coupled to an electrical ground by transistor switches 428a, 428b, operating in tandem under control of the duplexing controller 468, as a DPST switch. Switched impedance module 432 includes ¼λ transmission line segments 434a, 434b coupled to the split ends of the associated secondary inductor pair 408 at interfaces 430a, 430b. Each transmission line segment 434a, 434b is switchably coupled to an electrical ground by DPST switches 438a, 438b, operating in tandem under control of the duplexing controller 468, as a DPST switch. In FIG. 4 the transmit port is active as a result of the virtual ground established by the switched impedance module 432 at split ends 430a, 430b. DPST switches 438a, 438b are open resulting in the positioning of a node of the ¼λ standing waves within transmission line segments 434a, 434b at the split ends. Conversely, the receive port is inactive as a result of the virtual open established by the switched impedance module 422 at split ends 420a, 420b. DPST switches 428a, 428b are closed resulting in the positioning of an antinode of the ¼λ standing waves within transmission line segments 424a, 424b at the split ends.

In an alternate embodiment of the invention the transmission line segments in the switched impedance modules may comprise ½λ segments as shown in FIG. 3B and with corresponding changes in the switch states associated with active and inactive ports as discussed above in connection with FIGS. 3A, 3B.

The transceiver in this embodiment of the invention is a wireless transceiver supporting an IEEE 802.11 standard. The transceiver includes a plurality of components forming the transmit path and the receive path.

The receive path components includes in the radio frequency (Rf) portion, a low noise amplifier (LNA) 452, a tunable oscillator 454 and a mixer 456 which down convert the received communication channel, for conversion in the analog-to-digital converter (ADC) 458. In the baseband portion domain conversion from the time to the frequency domain is performed in the Discrete Fourier Transform (DFT) module 460. The complex coefficients for each subchannel in each symbol interval are subject to demapping by the demapper 462. The demapper 462 outputs bits corresponding to the received communication stream. These bits are deinterleaved in deinterleaver 464, and decoded and descrambled in the decoder and descrambler 466 and output as received data.

The transmit path components include in the baseband portion the forward error correction (FEC) encoder and scrambler 480, the interleaver 482, the mapper 484 and the Inverse Discrete Fourier Transform (IDFT) module 486. The mapper converts the interleaved bits to symbols and the IDFT converts the symbols from the frequency domain to the time domain. In the radio frequency (Rf) portion the digital-to-analog converter (DAC) 488 delivers the resultant signal to the mixer 490 for upconversion and subsequent amplification by power amplifier 492.

The transmit and receive paths and specifically the amplifiers 492, 452 thereof couple through the associated balun balanced port 406 and 402 to the load, e.g. antenna 416 via the balun's common or unbalanced port 414.

Figure 5:
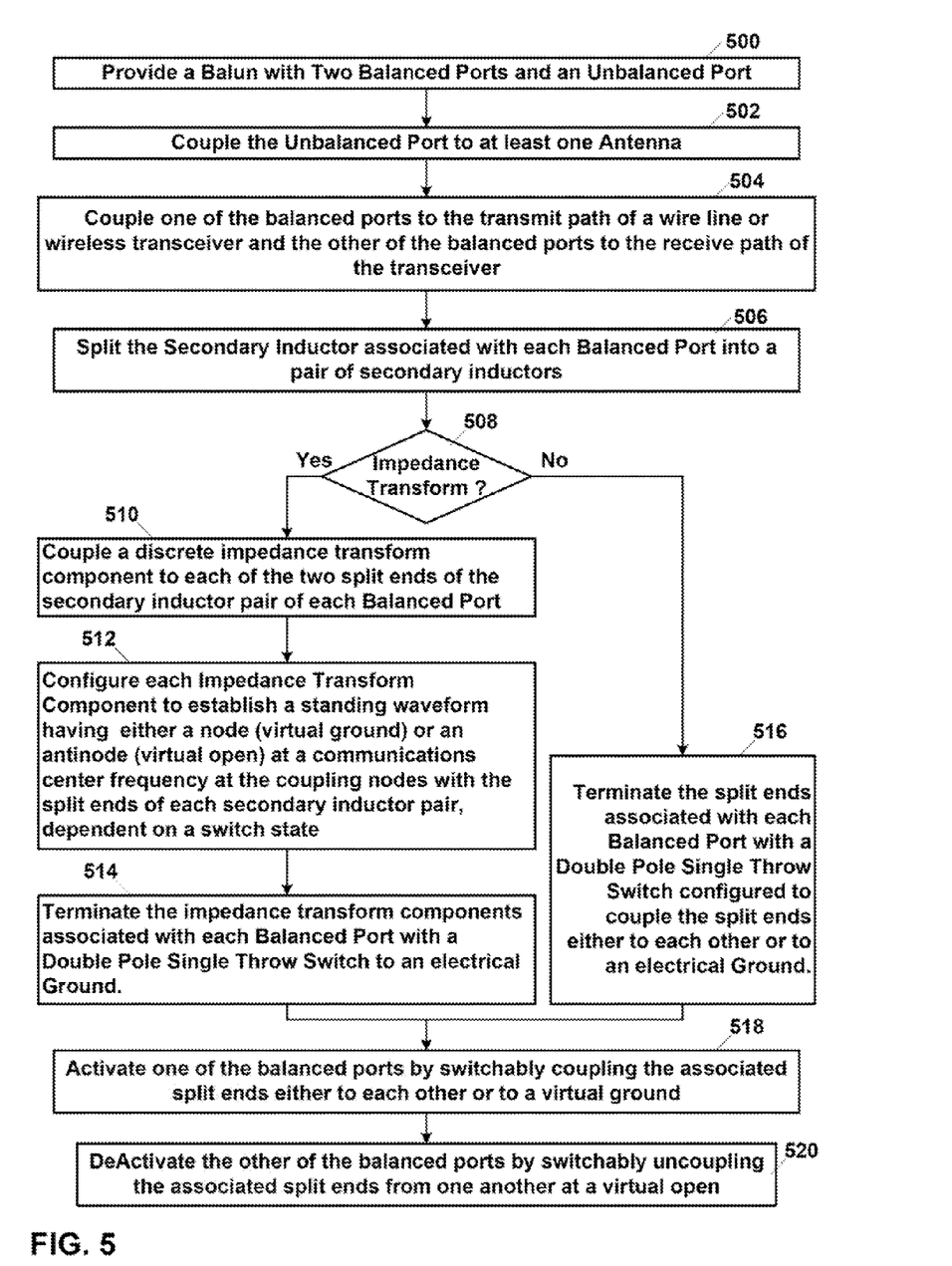
FIG. 5 is a process flow diagram of half-duplexing balun operation in accordance with an embodiment of the invention.

FIG. 5 is a process flow diagram of half-duplexing balun operation in accordance with an embodiment of the invention;

In process 500 a balun with two balanced ports and an unbalanced port is provided. In an embodiment of the invention such balun is comprised of two discrete baluns each with a unbalanced port and a balanced port, coupled at the unbalanced ports to one another. In process 502 the unbalanced port is coupled to at least one antenna. In a multiple-input multiple-output (MIMO) transceiver embodiment of the invention there would be separate baluns for each antenna. In process 504 one of the balanced ports is coupled to the transmit path of a transceiver, e.g. wire line or wireless, and the other is coupled to the receive path. Next in process 506 the secondary inductors associated with each balanced port are split into a corresponding pair of secondary inductors.

If the design does not include impedance transform elements, e.g. ¼λ or ½λ transmission line segments in the switched impedance modules then control passes in decision process 508 to process 516. In process 516 the split ends associated with the secondary inductor of each balanced port are terminated with a DPST switch configured to couple the split ends either to each other or to an electrical ground.

Alternately, if the design includes impedance transform elements in the switched impedance modules then control passes to process 510. In process 510 each impedance transform component within the switched impedance module is configured to establish a standing waveform having either a node corresponding to a virtual ground or an antinode corresponding to a virtual open at a communications center frequency at the coupling nodes or interface with the split ends of each secondary inductor pair dependent on a switch state. Then in process 514 each impedance transform component associated with the switched impedance module for each balanced port is terminated with a DPST switch to an electrical ground.

In either case, control then passes to process 518. In process 518 one of the balanced ports is activated by switchably coupling the associated split ends either to each other or to a virtual ground. Next in process 520 the other of the balanced ports is deactivated by switchably uncoupling the associated split ends of the secondary inductor from one another at a virtual open.

The components and processes disclosed herein may be implemented as software, hardware, or a combination thereof, without departing from the scope of the Claimed invention.

The foregoing description of a preferred embodiment of the invention has been presented for purposes of illustration and description. It is not intended to be exhaustive or to limit the invention to the precise forms disclosed. Obviously many modifications and variations will be apparent to practitioners skilled in this art. It is intended that the scope of the invention be defined by the following claims and their equivalents.

What is claimed is:

1. A transceiver supporting communications on a communications medium, and the transceiver comprising:
   a plurality of components coupled to one another to form a transmit path and a receive path;
   a balun having;
      a primary inductor configured to couple to the communications medium at an unbalanced port end thereof;
      two pairs of secondary inductors each configured to electromagnetically couple with the primary inductor and each providing an associated one of two balanced ports coupled to the plurality of components forming the transmit path and the receive path respectively, and
      switched impedance modules each coupled to a corresponding one of the two pairs of secondary inductors to switchably split into a virtual open one pair of secondary inductors associated with an inactive one of the balanced ports and to couple another pair of secondary inductors associated with an active one of the balanced ports either to each other or to a virtual ground; thereby supporting half duplex transmit or receive communications via opposing switch states.

2. The transceiver of claim 1, wherein each switched impedance module of the balun further comprises:
   a double-pole single-throw (DPST) switch uncoupling the associated pair of secondary inductors from one another to inactivate the corresponding port and coupling the associated pair of secondary inductors to each other to activate the corresponding port.

3. The transceiver of claim 1, wherein each switched impedance module of the balm further comprises:
   a double-pole single-throw (DPST) switch uncoupling the associated pair of secondary inductors from one another to inactivate the corresponding port and coupling the associated pair of secondary inductors to an electrical ground to activate the corresponding port.

4. The transceiver of claim 1, wherein each switched impedance module of the balun further comprises:
   impedance transform components each individually switchably coupled in series between an electrical ground and each of the secondary inductors of the associated pair of secondary inductors and each impedance transform component configured to establish a standing waveform having either a node or an antinode at a communications center frequency of the transceiver at each of the secondary inductors depending on a switch state; thereby allowing activation or deactivation of a balanced port by varying the placement of the standing waveform established in the corresponding impedance transform components.

5. The transceiver of claim 4 wherein each impedance transform component comprises a ¼ wavelength transmission line segment or odd integer multiples thereof.

6. The transceiver of claim 4 wherein each impedance transform component comprises a ½ wavelength transmission line segment or integer multiples thereof.

7. The transceiver of claim 1 wherein the balun further comprises:
   a duplexing controller coupled to the switched impedance modules to control the opposing switch states thereof.

8. The transceiver of claim 1, wherein the transceiver comprises one of a wire line transceiver configured to couple to a wire line communications medium and a wireless transceiver configured to couple to a wireless communications medium.

9. A balun comprising:
   a primary inductor providing an unbalanced port at an end thereof for coupling to a communication medium;
   two pairs of secondary inductors each configured to electromagnetically couple with the primary inductor and each providing an associated one of two balanced ports, and
   switched impedance modules each coupled to a corresponding one of the two pairs of secondary inductors to switchably split into a virtual open one pair of secondary inductors associated with an inactive one of the balanced ports and to couple either to each other or to a virtual ground; another pair of secondary inductors associated with an active one of the balanced ports; thereby supporting half duplex transmit and receive communications via opposing switch states.

10. The balun of claim 9, wherein each switched impedance module of the balun further comprises:
    a double-pole single-throw (DPST) switch uncoupling the associated pair of secondary inductors from one another to inactivate the corresponding; port and coupling the associated pair of secondary inductors to each other to activate the corresponding port.

11. The balm of claim 9, wherein each switched impedance module of the balun farther comprises:
    a double-pole single-throw (DPST) switch uncoupling the associated pair of secondary inductors from one another to inactivate the corresponding port and coupling the associated pair of secondary inductors to an electrical ground to activate the corresponding port.

12. The balun of claim 9, wherein each switched impedance module of the balun further comprises:
    impedance transform components each individually switchably coupled in series between an electrical ground and each of the secondary inductors of the associated pair of secondary inductors and each impedance transform component configured to establish a standing waveform having either a node or an antinode at a communications center frequency of the balun at each of the secondary inductors depending on a switch state; thereby allowing activation or deactivation of a balanced port by varying the placement of the standing waveform established in the corresponding impedance transform components.

13. The balun of claim 12 wherein each impedance transform component comprises a ¼ wavelength transmission line segment or odd integer multiples thereof.

14. The balun of claim 12 wherein each impedance transform component comprises a ½ wavelength transmission line segment or integer multiples thereof.

15. The balun of claim 9 further comprising:
   a duplexing controller coupled to the switched impedance modules to control the opposing switch states thereof.

16. A method for half-duplexing a balun having two balanced ports and an unbalanced port, and the method comprising:
   providing a primary inductor baying the unbalanced port at an end thereof;
   providing two secondary inductors electromagnetically coupled to the primary inductor;
   splitting each of the two secondary inductors into a corresponding pair of secondary inductors each having an associated one of the two balanced ports;
   activating one of the balanced ports by switchably coupling associated ends of the corresponding one of the two secondary inductors either to each other or to a virtual ground; and
   de-activating the other of the balanced ports by switchably uncoupling associated ends of the corresponding other of the two secondary inductors from one another at a virtual open.

17. The method for half-duplexing a balun of claim 16, further comprising:
   switchably couple impedance transform components in series between an electrical ground and each of the secondary inductors split in the splitting act;
   configure each impedance transform component to establish a standing waveform having either a node or an antinode at the coupling with the secondary inductors dependent on a switch state; thereby activating or deactivating a corresponding one of the balanced ports.

\* \* \* \* \*

UNITED STATES PATENT AND TRADEMARK OFFICE
CERTIFICATE OF CORRECTION

PATENT NO. : 8,964,605 B1  
APPLICATION NO. : 13/761147  
DATED : February 24, 2015  
INVENTOR(S) : Saied Ansari

Page 1 of 1

It is certified that error appears in the above-identified patent and that said Letters Patent is hereby corrected as shown below:

In the Claims

Column 11 line 13 Please delete "baying" and insert -- having --

Signed and Sealed this  
Seventh Day of July, 2015

Michelle K. Lee  
*Director of the United States Patent and Trademark Office*